(12) United States Patent
Karnik et al.

(10) Patent No.: US 7,023,023 B2
(45) Date of Patent: Apr. 4, 2006

(54) OPTICAL INTERCONNECTS IN INTEGRATED CIRCUITS

(75) Inventors: Tanay Karnik, Portland, OR (US); Jianping Xu, Portland, OR (US)

(73) Assignee: Intel Corporation, Santa Clara, CA (US)

(*) Notice: Subject to any disclaimer, the term of this patent is extended or adjusted under 35 U.S.C. 154(b) by 206 days.

(21) Appl. No.: 10/426,396

(22) Filed: Apr. 30, 2003

(65) Prior Publication Data

US 2004/0217373 A1    Nov. 4, 2004

(51) Int. Cl.
    *H01L 33/00*    (2006.01)
(52) U.S. Cl. .......................... 257/98; 257/99
(58) Field of Classification Search ............. 257/98, 257/99, 431–434, 458; 438/23, 26, 57, 59, 438/64, 69, 88
    See application file for complete search history.

(56) References Cited

U.S. PATENT DOCUMENTS

| | | | |
|---|---|---|---|
| 6,380,563 B1 * | 4/2002 | Farnworth et al. | 257/99 |
| 6,608,359 B1 * | 8/2003 | Kitahata | 257/432 |
| 6,803,639 B1 * | 10/2004 | Ono et al. | 257/433 |
| 2004/0217366 A1 * | 11/2004 | Gale et al. | 257/98 |

OTHER PUBLICATIONS

Hochneg, H, et al., "Formation of Micro-Lens by Reflow of Dual Photoresist", *Digest of Papers Microprocesses and Nanothechnology*, 2002 International Microprocesses and Nanotechnology Conference,(Nov. 2002), pp. 198-199.

King, Wilton W., et al., "Modular Adapters for Fiber Optics", *IEEE Transactions on Components, Packaging, and Manufacturing Technology*, Part A, vol. 21, No. 1,(Mar. 1998), pp. 186-191.

Ng, Wai L., et al., "An efficient room-temperature silicon-based light-emitting diode", *Nature*, vol. 410,(Mar. 8, 2001), pp. 192-194, 470.

Yee, Youngjoo , et al., "Micro Solid Immersion Lens Fabricated by Micro-Molding for Near-Field Optical Data Storage", *2000 IEEE/LEOS International Conference on Optical MEMS*, (Aug. 2000), pp. 91-92.

* cited by examiner

*Primary Examiner*—David A. Zarneke
(74) *Attorney, Agent, or Firm*—LeMoine Patent Services, PLLC

(57) ABSTRACT

An integrated circuit die includes optical interconnect ports on a first side and electrical interconnect ports on a second side.

16 Claims, 8 Drawing Sheets

OPTICAL INTERCONNECTS IN INTEGRATED CIRCUITS

FIELD

The present invention relates generally integrated circuits and systems, and more specifically to interconnects in integrated circuits and systems.

BACKGROUND

Integrated circuits typically have interconnect ports to communicate with other integrated circuits and other systems. Signals typically travel from an interconnect port on one integrated circuit, through a transmission medium, and to an interconnect port on another circuit or system to effect communications between the integrated circuits. Examples of transmission media include wires and traces within circuit boards, and cabling between circuit boards. As signal speeds increase, electrical signals suffer from attenuation in amplitude (voltage/current) and distortion in phase (time) as they travel through the transmission media. Signal rise and fall times at the receiver are slower than those sent at the transmitter. This can result in a smaller eye opening at the receiver.

FIG. 1 shows a prior art circuit assembly including circuit board 120, integrated circuit die 104, package 102, package substrate 106, heat sink 140, and off-board connection 130. As shown in FIG. 1, the electrical trace connecting integrated circuit die 104 to off-board connection 130 travels through the die-package boundary 108, package trace 109, package-board boundary 110, a long copper electrical trace 122 on circuit board 120 and then through jumper connection 132. In addition to attenuation, signals traveling on this path experience various discontinuities at die-package boundary 108, package-board boundary 110, and jumper connection 132. Due to skin effect loss in the various electrical traces, dielectric loss in the electrical medium, and the various discontinuities in the signal path, the signal gets distorted when traveling from integrated circuit die 104 to off-board connection 130. This distortion can take many forms, including but not limited to: attenuation, phase distortion, reflections, and delay.

For the reasons stated above, and for other reasons stated below which will become apparent to those skilled in the art upon reading and understanding the present specification, there is a need in the art for alternate integrated circuit interconnection techniques.

DESCRIPTION OF EMBODIMENTS

Figure 1:
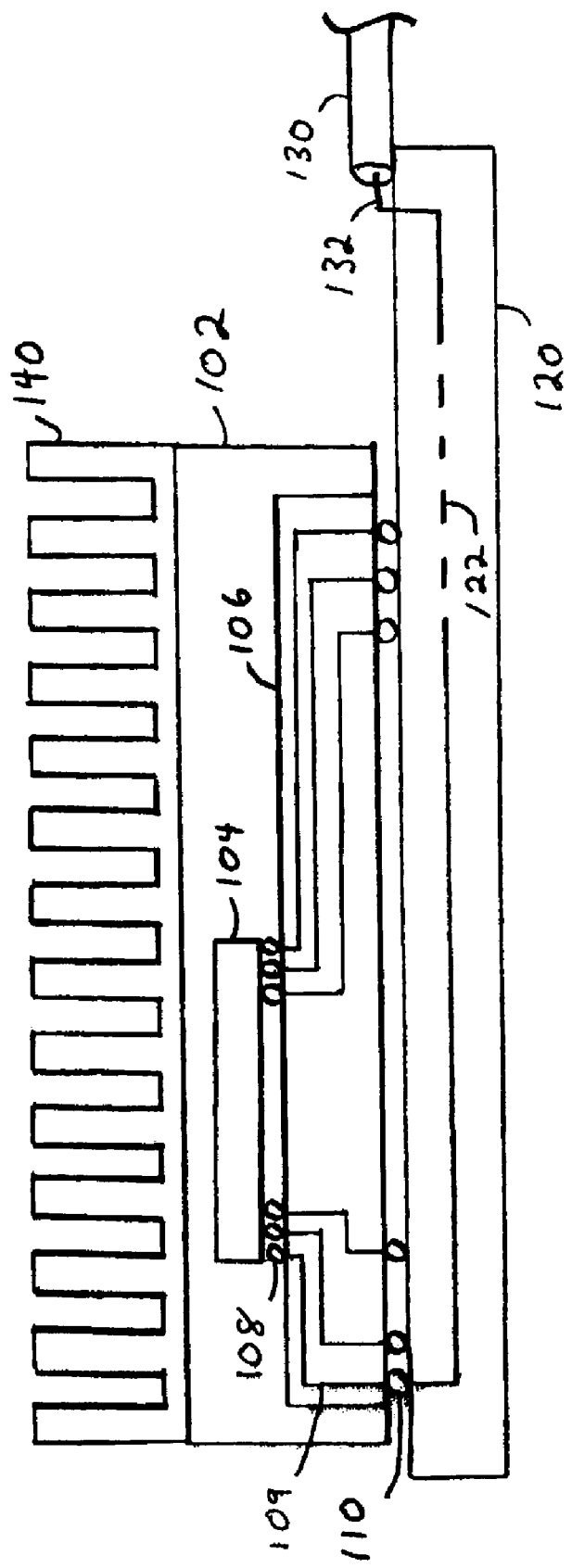
FIG. 1 shows a cross-section of a prior art circuit assembly.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
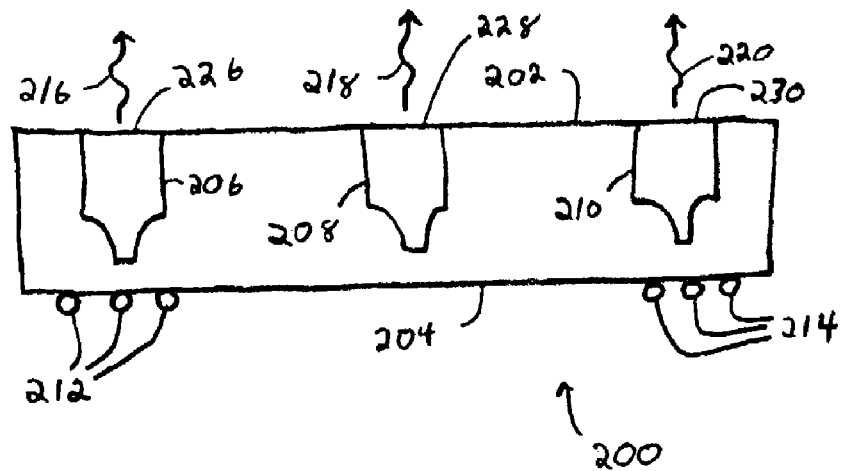
FIG. 2 shows a cross-section of an integrated circuit die.

FIG. 2 shows a cross-section of an integrated circuit die. Integrated circuit die 200 can be manufactured using any suitable material. For example, in some embodiments, integrated circuit die 200 is manufactured with a silicon substrate. Also for example, in other embodiments, integrated circuit die 200 is manufactured with a silicon-germanium substrate. Integrated circuit die 200 is shown with a backside 202 and a front side 204 substantially parallel to each other.

In some embodiments, front side 204 is the side of integrated circuit die 200 upon which active circuitry is placed. For example, during processing of integrated circuit die 200, multiple layers of material can be deposited, etched, and doped on front side 204. In these embodiments, backside 202 includes large amounts of the base material of the original wafer. For example, when the original wafer is made of silicon, backside 202 includes relatively large amounts of silicon.

Integrated circuit die 200 includes interconnect ports to receive power and to send and receive signals. Optical interconnect ports 226, 228, and 230 are located on backside 202, and are utilized to send and receive optical signals. Electrical interconnect ports 212 and 214 are located on front side 204, and may be utilized to send and receive electrical signals, and can also be utilized to receive power.

Electrical interconnect ports 212 and 214 can be any kind of interconnect port that utilize electrical communications techniques. For example, in some embodiments, electrical interconnect ports 212 and 214 carry electrical signals represented by voltage or current waveforms. In some embodiments, electrical interconnect ports 212 and 214 are not used to send and receive signals, and instead are only used to receive power. In these embodiments, optical interconnect ports 226, 228, and 230 are utilized for signaling to and from integrated circuit die 200. Electrical interconnect ports 212 and 214 can be created on integrated circuit die 200 in many ways. For example, electrical interconnect ports 212 and 214 may include solder balls coupled to pads suitable for a flip-chip application.

Electrical interconnect ports 212 and 214 can be placed anywhere on front side 204. For example, in some embodiments, electrical interconnect ports 212 and 214 are arranged around the perimeter of front side 204, and in other embodiments, electrical interconnect ports 212 and 214 are distributed across front side 204 with varying density.

Integrated circuit die 200 includes lasing elements 206, 208, and 210. In some embodiments, lasing elements 206, 208, and 210 are vertical cavity lasers manufactured in the substrate of integrated circuit die 200. As shown in FIG. 2, lasing elements 206, 208, and 210 are coupled to optical interconnect ports 226, 228, and 230, respectively. Laser light produced by lasing elements 206, 208, and 210 exits integrated circuit die 200 at optical interconnect ports 226, 228, and 230, respectively. The laser light is shown at 216, 218, and 220. For a discussion of example lasing elements, see Wilmsen, Temkin, Coldren; *VCSELS*, (Cambridge University Press 1999) (ISBN 0-521-59022-1); see also W. L. Ng et al., *An efficient room-temperature silicon-based light-emitting diode*, Nature 410, 192–194 (08 Mar. 2001).

Laser light may be generated at many different wavelengths. In some embodiments, light at substantially 1300 nanometers (nm) wavelength is generated, and the light can be collected at the backside of the integrated circuit die with relatively high efficiency, in part because silicon is practically transparent at this wavelength.

In some embodiments, photodetectors are integrated into, or placed alongside, lasing elements in integrated circuit die 200. In these embodiments, optical interconnect ports 226, 228, and 230 transmit and receive light. Also in some embodiments, data stream serializers and laser modulators are included to achieve very high bandwidth optical data streams with low loss.

For simplicity of illustration, integrated circuit die 200 is shown with only three optical interconnect ports. In some embodiments, many more optical interconnect ports exist. For example, in some embodiments, hundreds or thousands of optical interconnect ports exist on backside 202.

Figure 3:
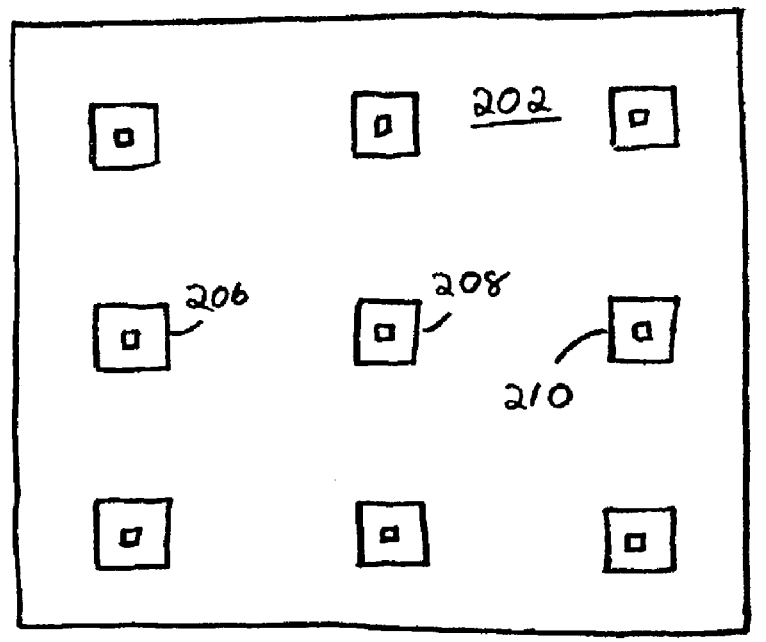
FIG. 3 shows a plan view of an integrated circuit die.

FIG. 3 shows a plan view of an integrated circuit die. This plan view of integrated circuit die 200 shows lasing elements 206, 208, and 210 as seen through optical interconnect ports on backside 202. The lasing elements are shown having square outlines, but this is not meant to be a limitation. Other shapes of lasing elements exist in various embodiments of the present invention.

FIG. 3 shows nine lasing elements spaced relatively far apart and arranged in a regular grid. In some embodiments, many more than nine lasing elements exist in a very small area. For example, in some embodiments, lasing elements have a width on the order of between one and one hundred microns, and many lasing elements are arranged very close to each other. Many different embodiments of the invention exist having varying numbers of lasing elements, with various shapes, arrangements, and spacing.

Figure 4:
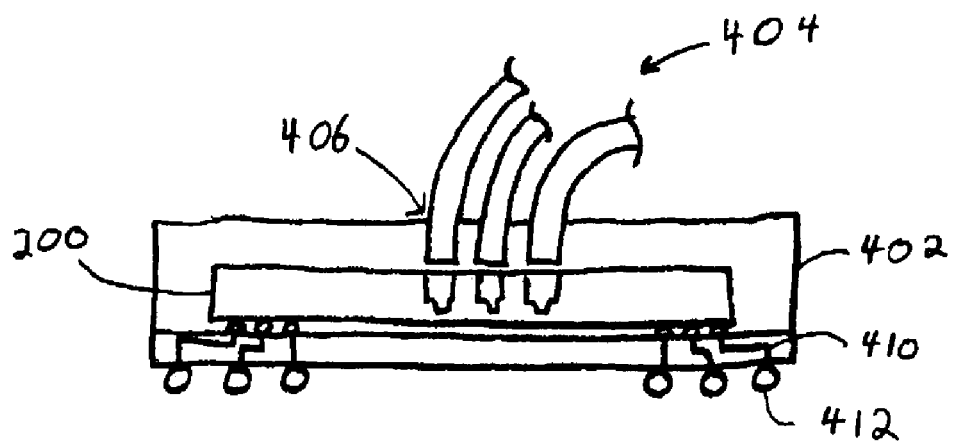
FIG. 4 shows a cross-section of a packaged integrated circuit die.

FIG. 4 shows a cross-section of a packaged integrated circuit die. In embodiments represented by FIG. 4, integrated circuit die 200 is packaged within package 402. Package 402 includes signal interconnects 410 configured to couple the electrical interconnect ports on the integrated circuit die to electrical interconnects 412 external to the package so power can be received, and so electrical signals can be transmitted and received.

Package 402 also includes apertures 406 through which optical media 404 can pass. Apertures 406 are substantially aligned with the optical interconnect ports on the backside of integrated circuit die 200 to allow optical coupling between the optical media and the lasing elements. In some embodiments, optical media 404 is coupled directly against integrated circuit die 200, and in other embodiments, a gap is included between optical media 404 and integrated circuit die 200. Optical media 404 can be any type of media capable of carrying an optical signal. Examples include single optical fibers and fiber bundles.

In some embodiments, each aperture in package 402 has a single optical fiber passing through, and in other embodiments, each aperture has multiple fibers passing through. In one embodiment, a single aperture exists in package 402, and a single bundle of optical media passes through the aperture.

Figure 5:
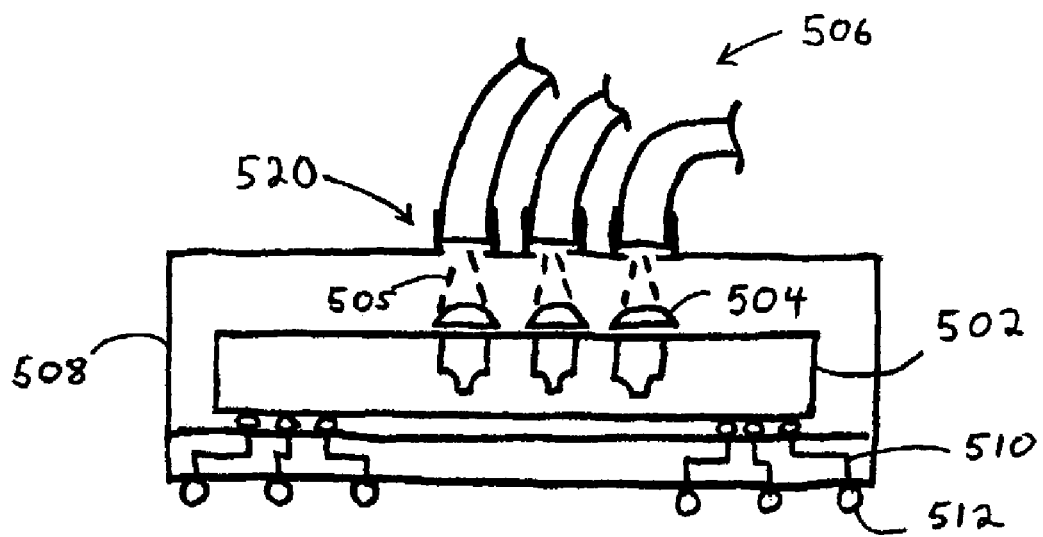
FIG. 5 shows a cross-section of another packaged integrated circuit die.

FIG. 5 shows a cross-section of another packaged integrated circuit die. Package 508 includes signal interconnects 510 configured to couple the electrical interconnect ports on the integrated circuit die to electrical interconnects 512 external to the package so power can be received, and so electrical signals can be transmitted and received.

Integrated circuit die 502 includes optical interconnect ports, electrical interconnect ports, and lasing elements similar to those of integrated circuit die 200 (FIGS. 2–4). Also shown in FIG. 5 are lenses 504 to focus light from the optical interconnect ports to the optical media 506. Focused light is shown at 505. Lenses 504 can be formed on integrated circuit die 502 using many different methods without departing from the scope of the present invention. For example, lenses 504 can be formed using techniques similar to those described in: H. Hocheng, C. T. Pan, C. C. Cheng, *Formation of micro-lens by reflow of dual photoresist*, Microprocesses and Nanotechnology Conference, Digest of Papers, 198–199 (2002); and Youngjoo Yee, Jong Uk Bu, Il-Joo Cho, Euisik Yoon, Su-Dong Moon, Shinill Kang, *Micro solid immersion lens fabricated by micromolding for near-field optical data storage*, 2000 IEEE/LEOS International Conference on Optical MEMS, 91–92, (2000)

Package 508 includes apertures 520 with attachment points to accept optical media 506. Each aperture 520 is substantially aligned with a lens such that focused light 505 can optically couple the optical media and the optical interconnect ports. Optical media 506 can be any type of media capable of carrying an optical signal. Examples include single optical fibers and fiber bundles.

In some embodiments, each aperture in package 508 has a single optical fiber attached thereto, and in other embodiments, each aperture has multiple fibers attached thereto. In one embodiment, a single aperture exists in package 508, and a single bundle of optical media is attached to the package to allow optical communications through the aperture. For examples of fiber attachment mechanisms, see W. W. King, D. L. Stephenson, *Modular adapters for fiber optics*, Components, Packaging, and Manufacturing Technology, Part A, IEEE Transactions on [see also Components, Hybrids, and Manufacturing Technology, IEEE Transactions on], 186–191, Volume 21 Issue 1, (March 1998).

Figure 6:
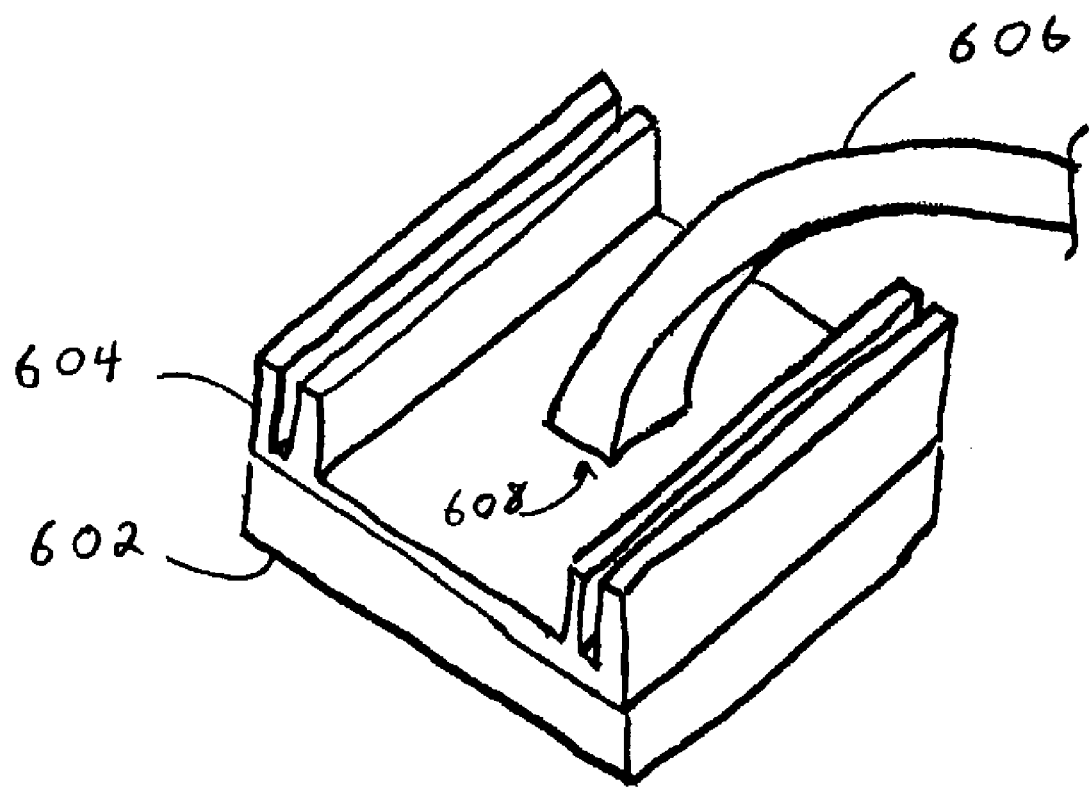
FIG. 6 shows a packaged integrated circuit with a heat sink and optical media.

FIG. 6 shows a packaged integrated circuit with a heat sink and optical media. Heat sink 604 is attached to packaged integrated circuit 602 to provide a mechanism for heat removal. Heat sink 604 has an aperture 608 through which optical media 606 can pass. In some embodiments, optical media 606 may attach to the package so light can pass through apertures as described with reference to FIG. 5. In other embodiments, optical media 606 may pass through apertures in the integrated circuit package as described with reference to FIG. 4.

Heat sink 604 can be of any type. For example, in some embodiments, heat sink 604 may be a machined piece of metal, and in other embodiments, heat sink 604 may be a heat pipe. For ease of illustration, heat sink 604 is shown with four fins. In some embodiments, heat sink 604 has many more than four fins.

Optical media 606 is shown as a single bundle of optical media. In some embodiments, the optical media is formed of many smaller bundles. The smaller bundles may have as few as one optical fiber each. The apertures in the heat sink, and the placement of optical media on the heat sink, can be arranged in any manner. For example, optical media 606 may be in one central location as shown in FIG. 6, or optical media 606 may be distributed across the device in smaller bundles. In some embodiments, optical media 606 includes many smaller bundles distributed between fins of heat sink 604.

Packaged integrated circuit 602 can be any device capable of optically communicating with optical media 606. For example, packaged integrated circuit 602 can be one of those shown in FIGS. 4 and 5. Many integrated circuits benefit from a heat sink to dissipate heat. Many other integrated circuits are packaged without heat sinks. Various embodiments of the present invention utilize heat sinks, and various other embodiments do not utilize heat sinks.

Figure 7:
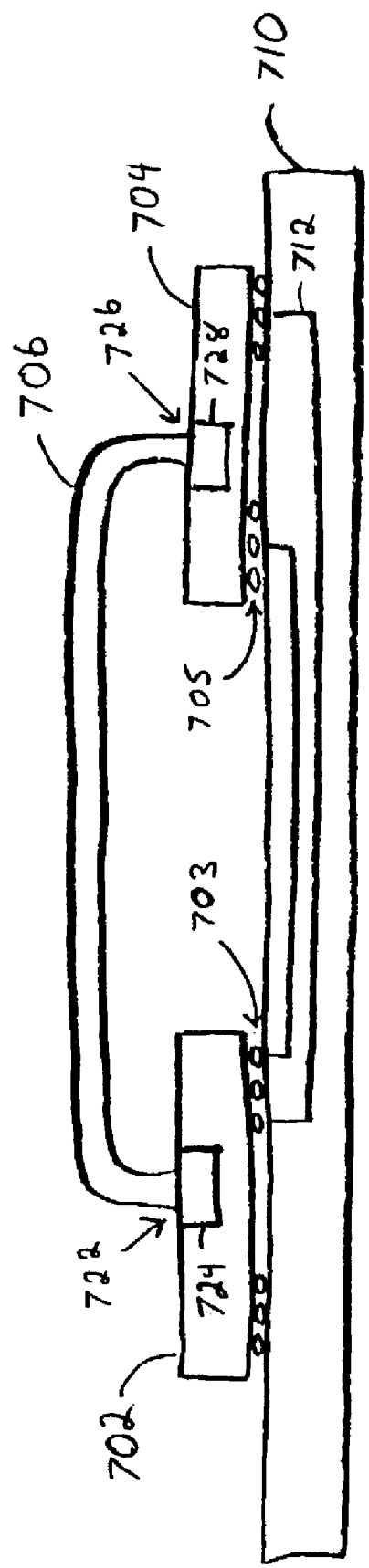
FIG. 7 shows a cross-section of two integrated circuits coupled to a circuit board.

FIG. 7 shows a cross-section of two integrated circuits coupled to a circuit board. Packaged integrated circuits 702 and 704 are electrically coupled to circuit board 710 by electrical interconnects 703 and 705, respectively. Integrated circuits 702 and 704 are coupled to each other by signal traces 712 and optical media 706.

Each packaged integrated circuit includes one or more apertures for receiving optical media, and each integrated circuit also includes devices for transmitting and/or receiving optical signals. For example, packaged integrated circuit 704 includes aperture 726 and device 728, and packaged integrated circuit 702 includes aperture 722 and device 724. In some embodiments, integrated circuit 702 includes a microprocessor, integrated circuit 704 includes a memory, and devices 724 and 728 include lasing elements configured as optical transmitters and photodetectors configured as optical receivers.

Integrated circuits 702 and 704 can be any type of integrated circuits capable of including optical devices as shown. For example, either integrated circuit can be a processor such as a microprocessor, a digital signal processor, a microcontroller, or the like. Integrated circuits 702 and 704 can also be integrated circuits other than a processor such as an application-specific integrated circuit (ASIC), a communications device, a memory controller, or a memory such as a dynamic random access memory (DRAM).

Figure 8:
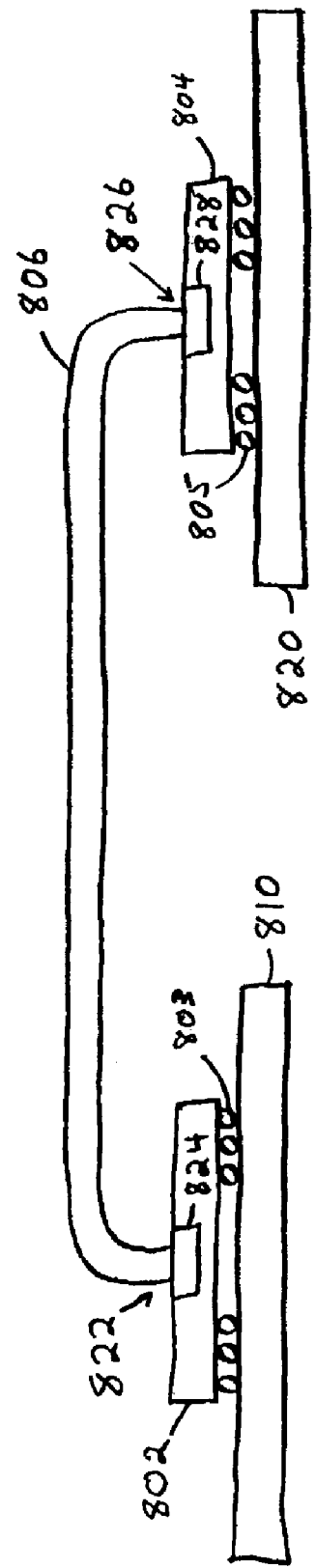
FIG. 8 shows cross-sections of two integrated circuits coupled to two circuit boards.

FIG. 8 shows a cross-section of two integrated circuits coupled to two circuit boards. Packaged integrated circuit 802 is electrically coupled to circuit board 810 by electrical interconnects 803, and packaged integrated circuit 804 is electrically coupled to circuit board 820 by electrical interconnects 805. Integrated circuits 802 and 804 are coupled to each other by optical media 806.

Each packaged integrated circuit includes one or more apertures for receiving optical media, and each integrated circuit also includes devices for transmitting and/or receiving optical signals. For example, packaged integrated circuit 804 includes aperture 826 and device 828, and packaged integrated circuit 802 includes aperture 822 and device 824. In some embodiments, integrated circuit 802 includes a microprocessor, integrated circuit 804 includes a memory, and devices 824 and 828 include lasing elements configured as optical transmitters and photodetectors configured as optical receivers.

Integrated circuits 802 and 804 can be any type of integrated circuits capable of including optical devices as shown. For example, either integrated circuit can be a processor such as a microprocessor, a digital signal processor, a microcontroller, or the like. Integrated circuits 802 and 804 can also be integrated circuits other than a processor such as an application-specific integrated circuit (ASIC), a communications device, a memory controller, or a memory such as a dynamic random access memory (DRAM).

Circuit boards 810 and 820 can be in close proximity to each other, or can be far from each other. For example, in some embodiments, circuit boards 810 and 820 are in separate systems located many meters or kilometers from each other. These separate systems may be more than about two meters apart, ten meters apart, or hundreds of meters apart. Optical media 806 can carry optical signals from one system to the other efficiently, and with little or no attenuation. Further, the electrical discontinuities discussed above with reference to FIG. 1 do not exist in the optical signal path shown in FIG. 8.

Figure 9:
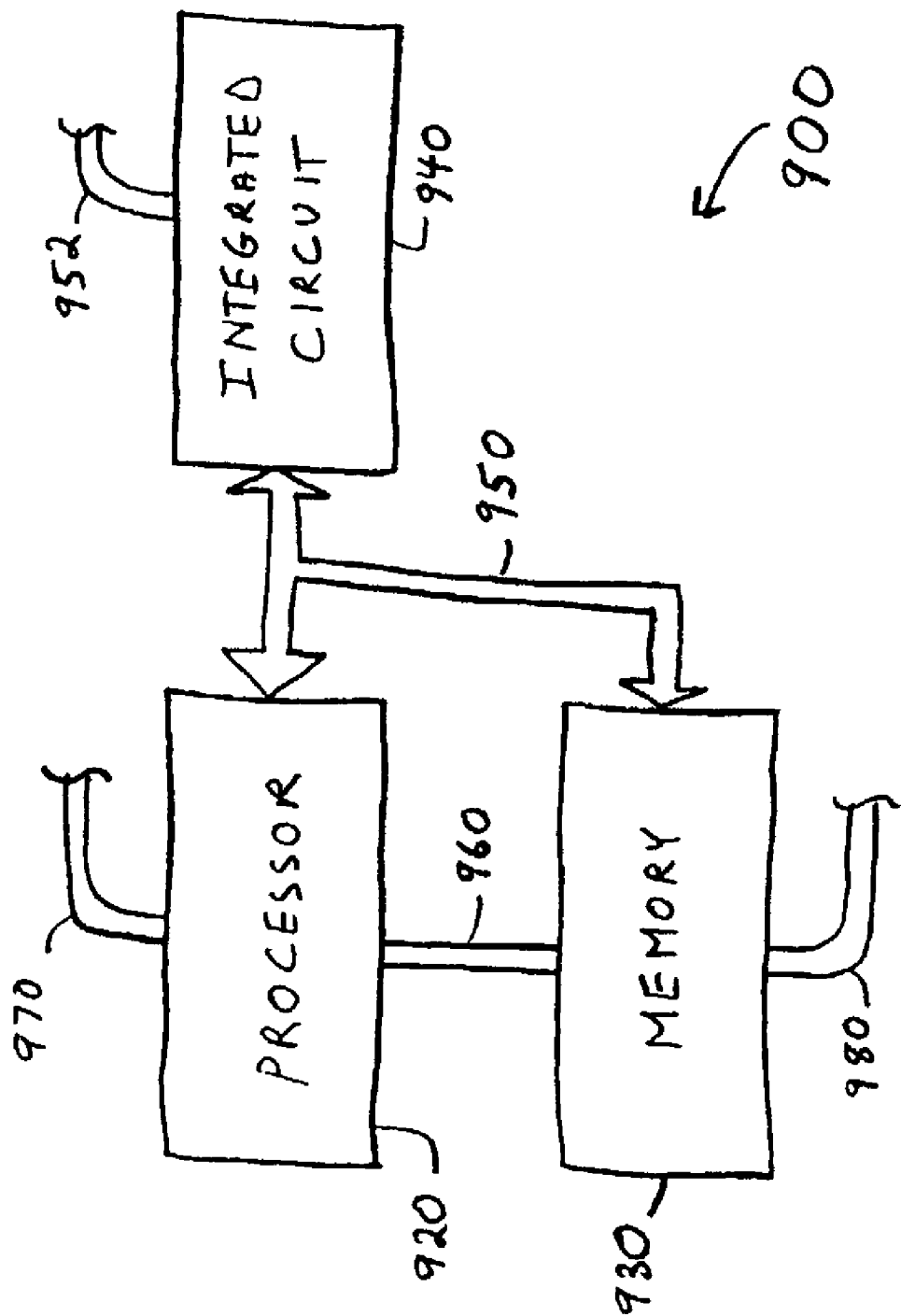
FIG. 9 shows an electronic system.

FIG. 9 shows a system diagram in accordance with various embodiments of the present invention. System 900 includes processor 920, memory 930, and integrated circuit 940 coupled by bus 950. Various devices within system 900 are also coupled by optical media. For example, processor 920 and memory 930 are coupled by optical media 960. Each of processor 920, memory 930, and integrated circuit 940 may also be coupled to other devices (not shown) by optical media. For example, processor 920 is coupled to optical media 970, memory 930 is coupled to optical media 980, and integrated circuit 940 is coupled to optical media 952.

Processor 920, memory 930, and integrated circuit 940 can be any of the packaged integrated circuit embodiments previously described, or equivalents thereof. For example, processor 920 can be a packaged integrated circuit with optical media attached to the package, or passing through apertures in the package. Also for example, processor 920 may be a packaged integrated circuit with a heat sink that has apertures for optical media 970 and 960 to pass through.

Integrated circuit 940 can be any type of integrated circuit. Examples include, but are not limited to, an application-specific integrated circuit (ASIC), a communications device, a modem, a testing device, a network router, a memory controller, or a memory such as a dynamic random access memory (DRAM).

Processor 920 is coupled to integrated circuit 940 by bus 950. In some embodiments, bus 950 is a bus of electrical conductors such as signal traces 712 (FIG. 7). In other embodiments, bus 950 is made up of cabling or wiring harnesses.

Memory 930 represents an article that includes optical communications circuits. For example, memory 930 may be a random access memory (RAM), read only memory (ROM), flash memory, or any other type of memory that includes optical interconnect ports configured to be coupled to optical media.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 10:
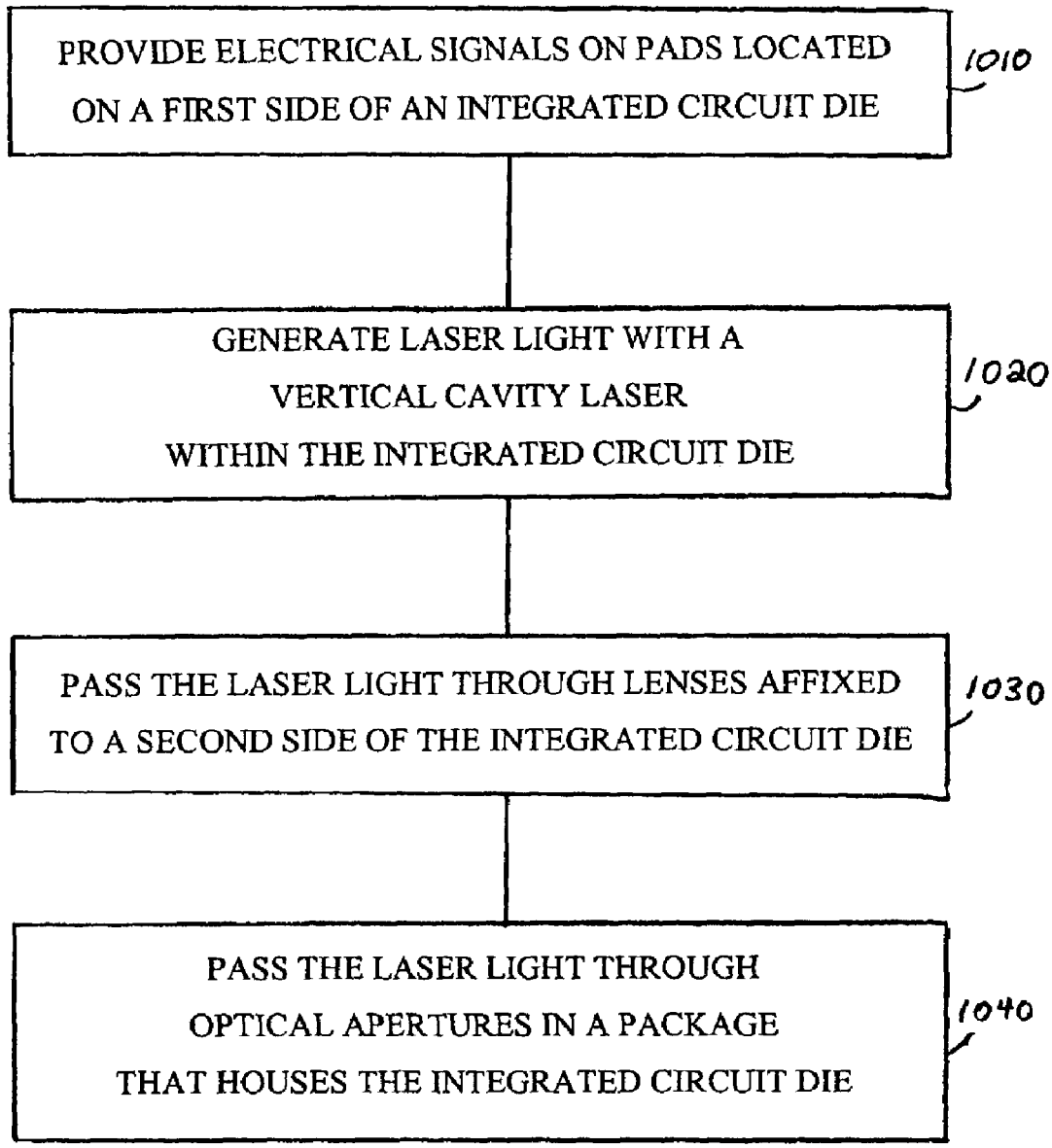
FIG. 10 shows a flowchart in accordance with various embodiments of the present invention.

FIG. 10 shows a flowchart in accordance with various embodiments of the present invention. In some embodiments, method 1000, or portions thereof, is performed by an integrated circuit with optical interconnect ports such as integrated circuit 200 (FIGS. 2–4). In other embodiments, method 1000 is performed by an integrated circuit with optical interconnect ports and lenses such as integrated circuit 502 (FIG. 5). The various actions in method 1000 may be performed in the order presented, or may be performed in a different order. Further, in some embodiments, some actions listed in FIG. 10 are omitted from method 1000.

Method 1000 is shown beginning with block 1010 in which electrical signals are provided on pads located on a first side of an integrated circuit die. The pads referred to in block 1010 are, in some embodiments, represented by the electrical interconnect ports described with respect to the previous figures. In block 1020, laser light is generated with a vertical cavity laser within the integrated circuit die. The vertical cavity laser referred to in block 1020 represents a silicon lasing element in an integrated circuit die, such as lasing elements 206, 208, and 210 (FIG. 2).

In block 1030, the laser light is passed through lenses affixed to a second side of the integrated circuit die. The lenses referred to in block 1030 correspond in some embodiments to lenses 504 (FIG. 5). In block 1040, the laser light is passed through optical apertures in a package that houses the integrated circuit die. For example, referring back to FIGS. 4 and 5, the laser light can pass through apertures 406 or 520.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
   a package having optical apertures; and
   an integrated circuit die mounted to the package, the integrated circuit die having a backside with optical interconnect ports, and a front side with active circuitry and electrical interconnect ports, and wherein the integrated circuit die includes vertical cavity lasers on the back side to emit laser light through the optical interconnect ports and optical apertures.

2. The apparatus of claim 1 further comprising optical media optically coupled to the optical interconnect ports through the optical apertures of the package.

3. The apparatus of claim 1 further comprising lenses coupled to the optical interconnect ports.

4. The apparatus of claim 1 wherein the integrated circuit die comprises a silicon substrate.

5. An integrated circuit die comprising:
   a silicon substrate having a front side and a back side;
   at least one active circuit residing on the front side;
   a plurality of electrical interconnects on the front side; and
   a plurality of vertical cavity lasers in the silicon substrate, wherein the plurality of vertical cavity lasers are manufactured on the back side of the silicon substrate to emit laser light from the back side.

6. The integrated circuit die of claim 5 wherein the at least one active circuit comprises a microprocessor.

7. The integrated circuit die of claim 5 wherein the at least one active circuit comprises a memory circuit.

8. The integrated circuit die of claim 5 wherein the plurality of electrical interconnects comprise power connections to provide power to the at least one active circuit.

9. The integrated circuit of claim 8 wherein the plurality of electrical interconnects further comprise signal connections.

10. The integrated circuit die of claim 5 further comprising at least one optical lens formed on the back side.

11. A packaged integrated circuit comprising:
    an integrated circuit die having a first side and a second side substantially parallel to the first side, wherein the integrated circuit die includes active circuitry on the first side, electrical interconnects on the first side, and vertical cavity lasers manufactured on the second side to emit laser light from the second side; and
    a package to accept the integrated circuit die in a flip-chip application, the package including electrical interconnects to electrically coupled to the electrical interconnects of the integrated circuit die, and wherein the package has at least one aperture through which the laser light can pass.

12. The packaged integrated circuit of claim 11 wherein the substrate comprises silicon.

13. The packaged integrated circuit of claim 11 wherein the substrate comprises silicon-germanium.

14. The packaged integrated circuit of claim 11 wherein the active circuitry includes a microprocessor.

15. The packaged integrated circuit of claim 11 wherein the active circuitry includes a memory circuit.

16. The packaged integrated circuit of claim 11 further comprising at least one optical lens formed on the second side of the integrated circuit die.

* * * * *